US008637993B2

(12) United States Patent
Wong et al.

(10) Patent No.: US 8,637,993 B2
(45) Date of Patent: Jan. 28, 2014

(54) 3D INTEGRATED CIRCUIT SYSTEM WITH CONNECTING VIA STRUCTURE AND METHOD FOR FORMING THE SAME

(75) Inventors: Chun Yu Wong, Clifton Park, NY (US); Ramakanth Alapati, Rexford, NY (US); Teck Jung Tang, Ballston Lake, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/453,043

(22) Filed: Apr. 23, 2012

(65) Prior Publication Data

US 2013/0277854 A1   Oct. 24, 2013

(51) Int. Cl.
*H01L 23/48* (2006.01)
*H01L 29/10* (2006.01)
*H01L 23/52* (2006.01)

(52) U.S. Cl.
USPC ............................. 257/774; 257/43; 257/778

(58) Field of Classification Search
USPC .............................. 257/778, 43, 774; 438/667
See application file for complete search history.

(56) References Cited

U.S. PATENT DOCUMENTS

| 2006/0118965 | A1* | 6/2006 | Matsui .......................... 257/774 |
| 2007/0099414 | A1* | 5/2007 | Frohberg et al. .............. 438/618 |
| 2010/0032764 | A1* | 2/2010 | Andry et al. ................... 257/369 |
| 2010/0237472 | A1* | 9/2010 | Gillis et al. .................... 257/621 |
| 2010/0289146 | A1* | 11/2010 | Ramm et al. ................... 257/770 |
| 2010/0297844 | A1* | 11/2010 | Yelehanka et al. ............ 438/667 |
| 2011/0095367 | A1* | 4/2011 | Su et al. ......................... 257/355 |

* cited by examiner

*Primary Examiner* — Long K Tran
*Assistant Examiner* — Dzung Tran
(74) *Attorney, Agent, or Firm* — Ingrassia Fisher & Lorenz, P.C.

(57) ABSTRACT

A method of forming an integrated circuit device includes providing a substrate including an active device, forming a through silicon via into the substrate, forming a device contact to the active device, forming a conductive layer over the through silicon via and the device contact, and forming a connecting via structure for electrically connecting the conductive layer with the through silicon via. An integrated circuit device includes a through silicon via formed into a substrate silicon material, a conductive layer formed over the through silicon via, and a connecting via structure formed between the conductive layer and the through silicon via for electrically connecting the conductive layer with the through silicon via. The connecting via structure comprises a first series of via bars intersected with a second series of via bars.

19 Claims, 5 Drawing Sheets

3D INTEGRATED CIRCUIT SYSTEM WITH CONNECTING VIA STRUCTURE AND METHOD FOR FORMING THE SAME

TECHNICAL FIELD OF THE INVENTION

The present invention relates generally to an integrated circuit system, and more particularly to an integrated circuit system with an improved through silicon via/conductive layer connection.

BACKGROUND OF THE INVENTION

Integrated circuits find application in many of today's consumer electronics, such as cell phones, video cameras, portable music players, printers, computers, calculators, automobiles, etc. Miniaturization of these consumer electronics while providing increased functional integration of memory and logic has long been one of the major drivers within the semiconductor industry. Consequently, manufacturers are turning to three-dimensional ("3D") packaging to achieve the required high level of functional integration necessary to support these products.

Through silicon vias (TSV's) provide one technique used within the industry for enabling three-dimensional stacking of integrated circuits (ICs), thereby providing the possibility of heterogeneous integration. Additionally, TSV technology offers a reduction in area consumed by the interconnections, while providing shortened electrical pathways with reduced RC delay.

Numerous methods of 3D package fabrication with TSV technology are now known in the art. In one example, a "connecting via" is introduced between the first metal layer of an IC and the TSV contact layer so as to electrically connect the IC devices in the multi-layer, stacked structure. In order to ensure a robust connection, it would be desirable to increase the contact area between the connection via and the TSV. Other desirable features and characteristics of the present invention will become apparent from the subsequent detailed description and the appended claims, taken in conjunction with the accompanying drawing figures and the foregoing technical field and background of the invention.

BRIEF SUMMARY OF THE INVENTION

In one embodiment, a method of forming an integrated circuit device includes providing a substrate including an active device, forming a through silicon via into the substrate, forming a device contact to the active device, forming a conductive layer over the through silicon via and the device contact, and forming a connecting via structure for electrically connecting the conductive layer with the through silicon via. The connecting via structure includes a first series of via bars intersected with a second series of via bars.

In another embodiment, a method for forming an integrated circuit device includes forming a connecting via structure for electrically connecting a conductive layer of the integrated circuit device with a through silicon via, wherein the connecting via structure includes a first series of via bars perpendicularly intersected with a second series of via bars.

In yet another embodiment, an integrated circuit device includes a through silicon via formed into a substrate silicon material, a conductive layer formed over the through silicon via, and a connecting via structure formed between the conductive layer and the through silicon via for electrically connecting the conductive layer with the through silicon via. The connecting via structure comprises a first series of via bars intersected with a second series of via bars.

BRIEF DESCRIPTION OF THE DRAWINGS

The invention will be better understood from a reading of the following detailed description, taken in conjunction with the accompanying figures in the drawings in which like numerals denote like or analogous elements, and wherein.

DETAILED DESCRIPTION OF THE INVENTION

Figure 1:
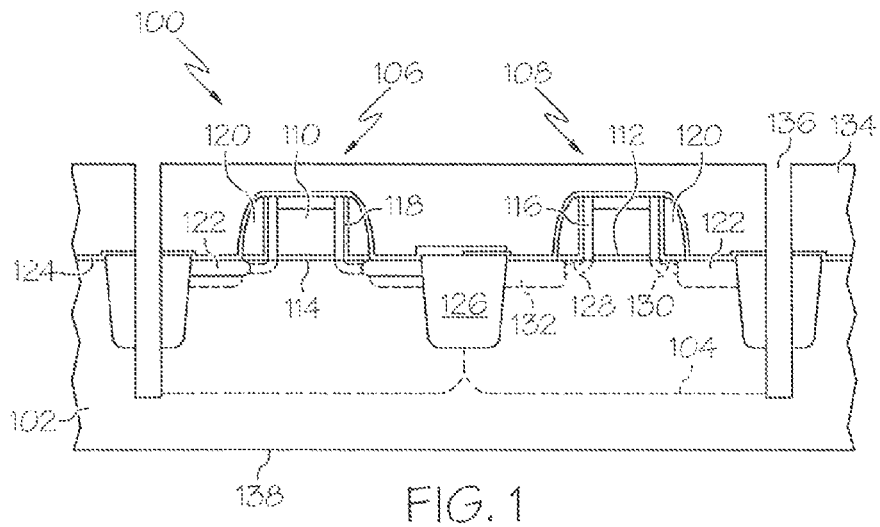
FIGS. 1-5 are partial cross-section views of an integrated circuit system illustrating method steps for forming a TSV electrically connected to a conductive layer.

The following detailed description is merely exemplary in nature and is not intended to limit the invention or the application and uses of the invention. Furthermore, there is no intention to be bound by any expressed or implied theory presented in the preceding technical field, background, or the following detailed description. For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

Metal-oxide-semiconductor (MOS) devices are a well-known form of field effect transistors (FETs). Complimentary metal-oxide-semiconductor (CMOS) devices, that is, with both P-channel (PMOS) and N-channel (NMOS) devices, are much used in integrated circuits (ICs). The term metal-oxide-semiconductor and the abbreviation "MOS" are widely used in the art to refer to insulated gate field effect transistors or devices (IGFETs) irrespective of whether they employ metals or some other form of conductor for the gates of such devices, and irrespective of whether they use oxides or some other form of dielectrics for the gate insulators. Semiconductors, doped semiconductors, metals, metal alloys, metal-semiconductor alloys, semi-metals and combinations thereof are non-limiting examples of suitable gate conductors. Oxides, nitrides, fluorides, combinations thereof and other inorganic and organic dielectrics are non-limiting examples of suitable gate insulators. Accordingly, the terms metal-oxide-semiconductor and the abbreviations MOS, MOSFET, PMOS, PFET, NMOS NFET and CMOS as used herein are intended to refer broadly to such insulated gate field effect transistors or devices and not be limited merely to those employing just metals and/or just oxides.

For convenience of explanation, embodiments of the invention are described herein for MOSFETs employing silicon (Si) semiconductor (SC), and with source and/or drain regions and gates. However, persons of skill in the art will understand that the invention is not limited merely to Si semiconductors and not merely to FETs, but also applies to other semiconductor materials and other types of SC devices, where electrical contacts closely spaced to but electrically insulated from other device regions are needed. Accordingly, the term FET should be interpreted broadly to include any type of SC device, the term "gate" should be interpreted broadly to include any kind of conductor or conductive region whether functioning as a MOSFET gate or not, and the terms "source" and/or "drain" (and the abbreviation "S-D") and "contacts" thereto should also be interpreted broadly to refer to any kind of SC region and any type of contact thereto, whether or not such region functions as a source or drain region of a FET or other type of device. Further, as used herein, the term "semiconductor" and the abbreviation "SC", singular or plural, are intended to include any kind of semiconductor material, including but not limited to single crystal semiconductors, polycrystalline semiconductors, amorphous semiconductors as well as organic and inorganic semiconductors. As used herein, the term "substrate", singular or plural is intended to include bulk semiconductor substrates, semiconductor layers, insulating substrates, and combinations thereof, such as but not intended to be limiting, semiconductor-on-insulator (SOI) substrates and insulator-on-semiconductor (IOS) substrates. Substrates may be single crystal, polycrystalline, amorphous, laminated or combinations thereof. For convenience of description, various conductors may be referred to as "metals", but unless indicated otherwise by the particular context, the words "metal" and "conductor", singular or plural, should be interpreted broadly to include any type of electrical conductor, whether metallic or not.

As noted above, the present invention relates to a connecting via structure between a metal layer and a through silicon via (TSV) in an integrated circuit (IC). An exemplary process for forming an IC with a TSV is provided in the following discussion regarding FIGS. 1-5. However, this invention is not to be understood as limited to any particular process for forming an IC with a TSV. Rather, any method of forming an IC with a TSVs will be suitable for use in the present invention. Thereafter, and in accordance with the embodiments described below, a connecting via structure can be provided for connecting the TSV to a metal layer. Referring now to FIG. 1, therein is shown a partial cross sectional view of an integrated circuit system 100 in an initial stage of manufacture in accordance with an embodiment of the present invention. In general, the integrated circuit system 100 may include one or more of an active device and/or a passive device. In such cases, a multitude of different regions (e.g., memory, logic, high voltage, etc.) can be formed over, on and/or within a substrate 102 for the manufacture of active and/or passive device structures by conventional deposition, patterning, photolithography, and etching techniques known in the semiconductor processing industry. Moreover, it will be appreciated by those skilled in the art that although the present embodiments are generally depicted with respect to two active device structures, it is to be understood that the system and methods described herein are applicable to one or more active device structures (e.g., NMOS or PMOS) formed within isolated, semi-dense or dense array configuration. In some embodiments, the substrate 102 may include a two hundred (200) mm or three hundred (300) mm semiconductor wafer, upon which any number of active and/or passive device structures and their interconnections could be formed. By way of example, the substrate 102 may include any semiconducting material, such as, Si, SiC, SiGe, Si/SiGe, SiGeC, Ge, GaAs, InAs, InP, other III/V or II/VI compound semiconductors, as well as silicon-on-insulator configurations. Additionally, the substrate 102 may also include doped and undoped configurations, epitaxial layers, strained configurations, and one or more crystal orientations (e.g., <100>, <110>, and/or <111> orientations), which may be strategically employed to optimize carrier mobility within NMOS and PMOS devices. The substrate 102 may also include any material that becomes amorphous upon implantation. In one embodiment, the substrate 102 may also include one or more of a well 104, such as an n-type well where p-type MOSFETs may be formed, a p-type well where n-type MOSFETs may be formed, and/or a twin well configuration (e.g., an n-type well adjacent a p-type well). In at least one embodiment, the well 104 may include a lightly doped well. It will be appreciated by those skilled in the art that a retrograde well implant may be used to obtain optimum electrical characteristics for the devices formed within the substrate 102.

One or more active device, such as an active device 106 and an active device 108, can be formed over, on and/or within the substrate 102 by conventional deposition, patterning, photolithography, and etching techniques known in the semiconductor processing industry for the manufacture of active and/or passive devices. In some embodiments, the first device 106 and the second device 108 may include one or more of an active device, such as one or more of an NMOS device or one or more of a PMOS device. In other embodiments, the first device 106 and the second device 108 may include a PMOS device and an NMOS device cooperatively coupled, thereby forming a CMOS device. However, it is to be understood that the first device 106 and the second device 108 are not limited to the preceding examples and may include any number of multi-electrode devices in which the current flowing between two specified electrodes is controlled or modulated by the voltage applied at a control electrode. In general, the first device 106 and the second device 108 may both include a gate 110, a gate dielectric 112, a channel 114, a first spacer 116, a first liner 118, a second spacer 120, a silicide contact 122, a dielectric layer 124, an isolation structure 126, a source/drain extension 128, a halo 130, a source/drain 132, a passivation layer 134, and a TSV opening 136.

In some embodiments, the gate 110 may be formed from conventional materials including doped and undoped semiconducting materials (such as, for example, polySi, amorphous Si, or SiGe), a metal, a metallic alloy, a silicide, a metal nitride, a metal oxide, a carbon nanotube, or a combination thereof. By way of example, if the gate 110 includes a metal, the metal may include copper, tungsten, aluminum, aluminum alloy, palladium, titanium, tantalum, nickel, cobalt, and molybdenum. Furthermore, by way of example, if the gate 110 includes a metal silicide, the metal silicide may include copper silicide, tungsten silicide, aluminum silicide, palladium silicide, titanium silicide, tantalum silicide, nickel silicide, cobalt silicide, erbium silicide, and molybdenum silicide. In accordance with the scope of the present embodiments, other materials, which may be known to those skilled in the art for gate structures, may also be used for the gate 110. Generally, the gate 110 can be formed by chemical vapor deposition (CVD), physical vapor deposition (PVD), silicidation, plating, and/or atomic layer deposition (ALD). The gate 110 may also include a multilayer structure and/or a dual structure including different gate heights for different gate structures.

The gate dielectric 112 may be made from materials including, but not limited to, silicon oxide, silicon oxynitride, silicon nitride, a silicon oxide/nitride/oxide stack, a high-k dielectric material (i.e., one having a dielectric constant value greater than silicon oxide), or a combination thereof. However, it is to be understood that the type of material chosen for the gate dielectric 112 is not limited to the preceding examples; for example, the gate dielectric 112 may include any material that permits induction of a charge in the channel 114 when an appropriate voltage is applied to the gate 110. In accordance with the scope of the present embodiments, other materials, which may be known to those skilled in the art for gate structures, may also be used for the gate dielectric 112. The gate dielectric 112 can be formed by thermal oxidation, ALD, CVD, or PVD. The gate dielectric 112 may also include a multilayer structure and/or different materials for NMOS and PMOS devices. In at least one embodiment, the gate dielectric 112 may include a multi-layer structure, such as a first layer of an oxide and a second layer of a high-k material.

The first spacer 116 can be formed adjacent the gate 110 and may include dielectric materials such as an oxide, a nitride, or a combination thereof, but preferably includes silicon dioxide. The first spacer 116 can be formed by a variety of techniques, including, but not limited to, physical vapor deposition, chemical vapor deposition and thermal oxidation, followed by an appropriate etch process that forms a substantially vertical sidewall, in at least one embodiment. The first liner 118 can be formed adjacent the first spacer 116 and may include dielectric materials such as an oxide, a nitride, or a combination thereof, but preferably includes silicon dioxide. The first liner 118 can be formed by a variety of techniques, including, but not limited to, physical vapor deposition, chemical vapor deposition and thermal oxidation, followed by an appropriate etch process, thereby forming a substantially "L"-shaped liner, in at least one embodiment. The L-shape results from depositing the first liner material 118, depositing the second spacer material 120 over the first liner material 118, and then etching the second spacer material 120. Excess liner material 118 not covered by the second spacer 120 is removed, and all that is left is the L-shaped line. The second spacer 120 can be formed adjacent the first liner 118 and typically includes a material (e.g., an oxide, a nitride, or a combination thereof) that can be selectively etched with respect to the material of the first liner 118. For example, if the first liner 118 is formed using silicon dioxide, the second spacer 120 can be formed using silicon nitride. For such a spacer material composition, a plurality of anisotropic etch recipes with moderately high etch selectivity are well-known within the art. The second spacer 120 can be formed by a variety of techniques, including, but not limited to, chemical vapor deposition and physical vapor deposition, followed by an appropriate anisotropic etch.

The integrated circuit system 100 may also include the silicide contact 122, such as a low resistance silicide or salicide electrical contact, formed over the gate 110 and the source/drain 132. In some embodiments, the silicide contact 122 may include any conducting compound that forms an electrical interface between itself and another material that is thermally stable and provides uniform electrical properties with low resistance. In other embodiments, the silicide contact 122 may include refractory metal materials such as, tantalum (Ta), cobalt (Co), titanium (Ti), tungsten (W), platinum (Pt), nickel (Ni), or molybdenum (Mo). In yet other embodiments, the silicide contact 122 formed over the source/drain 132 can be self-aligned to the second spacer 120 via a salicide process.

The dielectric layer 124 can be deposited over or on the entirety or portions of the integrated circuit system 100. In at least one embodiment, the dielectric layer 124 may include a barrier layer (e.g., silicon nitride) that protects the active regions within the substrate 102 from dopants in a subsequently deposited film or layer. By way of example, the dielectric layer 124 may include a silicon nitride layer deposited by a plasma enhanced chemical vapor deposition process. In other embodiments, the dielectric layer 124 may also include a stress memorization layer that transfers its stress to the first device 106 and the second device 108 upon annealing.

The isolation structure 126, which may include a shallow trench isolation structure, a local oxidation of silicon structure, and/or other suitable isolation features, can electrically isolate and/or separate the first device 106, the second device 108, and other devices from each other. In some embodiments, the isolation structure 126 can be made from a dielectric material such as silicon oxide, silicon nitride, or silicon oxynitride. In other embodiments, the isolation structure 126 may also include a multi-layer structure of one or more dielectric materials.

At this stage of manufacture, the integrated circuit system 100 may also include the source/drain extension 128, the halo 130, and/or the source/drain 132. It will be appreciated by those skilled in the art that the formation of the source/drain extension 128, the halo 130, and/or the source/drain 132 can be coordinated with the formation of the first spacer 116, the first liner 118, and/or the second spacer 120, thereby permitting a self-aligned process. As is well-known in the art, the source/drain extension 128 can be formed adjacent the channel 114. In general, the source/drain extension 128 may be formed to a shallow depth with a low concentration of impurities relative to a source and drain region to facilitate dimensional reductions for the scaling of the integrated circuit system 100. The impurities used to form the source/drain extension 128 may include n-type or p-type, depending on the first device 106 and/or the second device 108 being formed (e.g., n-type impurities for an NMOS device and p-type impurities for a PMOS device).

The halo 130 can be formed adjacent the source/drain extension 128. As is known in the art, a halo implant can help to decrease the length of the channel 114, which may be advantageous for minimizing punch-through current and controlling short channel effects, thereby improving the performance of an active device. In general, the halo 130 can be formed by implanting the substrate 102 with impurities of opposite conductivity type to that of the impurities used to form the source/drain 132 and the source/drain extension 128. For example, if the source/drain 132 and the source/drain extension 128 are formed with n-type impurities then the halo 130 can be formed with p-type impurities. The halo dopant material is typically implanted at an angle so that the dopant material can be implanted underneath the first spacer 116, the first liner 118, the second spacer 120, and/or the gate 110. In general, the angle of the implantation is typically substantially less than ninety degrees relative to the surface of the substrate 102, e.g., between about fifteen to about seventy-five degrees relative to the surface of the substrate 102. In some embodiments, the substrate 102 can be rotated (e.g., dual and quad halo implants) during the angled halo implantation to provide symmetrical forms of the halo 130. However, in other embodiments, the halo dopant implant may be implanted perpendicular to the surface of the substrate 102.

Subsequent to forming the first device 106 and the second device 108, the passivation layer 134 can be deposited over or on the entirety or portions of the integrated circuit system 100. Generally, the passivation layer 134 may include an oxide, a nitride, or a combination thereof. It will be appreciated by those skilled in the art that the passivation layer 134 can help to protect the underlying devices from subsequent processing steps, while providing an insulative effect from subsequently deposited conductive materials.

The TSV opening 136 can be formed from the top side through the passivation layer 134, the dielectric layer 124, the isolation structure 126, and into the substrate 102 in one or more regions of the integrated circuit system 100. In other embodiments, the TSV opening 136 can be formed all the way through the substrate 102. In yet other embodiments, the TSV opening 136 can be formed from a bottom side 138 of the substrate 102. It is to be understood that the TSV opening 136 may include a through-silicon-via (TSV) that can be used for electrical interconnections. Generally, the TSV opening 136 can be formed by machining and/or etching. In such cases, mechanical drilling, laser ablation, and certain wet and dry etches can be used, for example. It will be appreciated by those skilled in the art that the depth and diameter of the TSV opening 136 can vary with the via type, the application, the design specifications and/or the current technology process node (e.g., 45 nm, 32 nm, etc.) for the integrated circuit system 100. By way of example, the depth of the TSV opening 136 can vary from about 20 microns to about 500 microns and the diameter can vary from about 200 nm to about 200 microns. Generally, the aspect ratio for the TSV opening 136 can vary from about 0.3:1 to greater than about 20:1.

Figure 2:
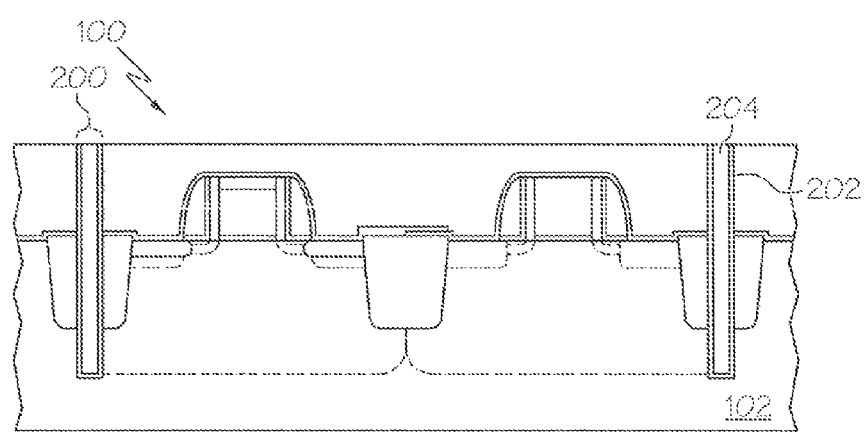

Referring now to FIG. 2, therein is shown the structure of FIG. 1 after forming a TSV 200. The TSV 200 may include a TSV barrier 202 and a TSV conductor 204. Generally, the TSV barrier 202 may include a dielectric material that helps to electrically insulate or isolate the TSV conductor 204 from the substrate 102. In at least one embodiment, the TSV barrier 202 may include an oxide layer formed by thermal oxidation, although it is understood that other materials and processes can be used. It will be appreciated by those skilled in the art that the TSV barrier 202 can be strategically designed to also help reduce electromigration of mobile ionic contaminants. It is to be understood that the TSV barrier 202 can be formed within the TSV opening 136, of FIG. 1. The TSV conductor 204 can be deposited over or on the TSV barrier 202 and may include any conductive material. In at least one embodiment, the TSV conductor 204 may include a tungsten or copper material. It will be appreciated by those skilled in the art that a seed layer can be deposited before filling with the TSV conductor 204 to improve the deposition and interface quality. Generally, the TSV conductor 204 can be deposited by any process that adequately fills each of the TSV opening 136, thereby forming a solid and robust electrical interconnection (e.g., one without substantial voids). It is to be understood that each of the TSV opening 136 can be overfilled to ensure adequate filling of the TSV opening 136. By way of example, the TSV conductor 204 can be deposited by a CVD, a PVD, an ALD type process, or by electro-chemical plating.

Figure 3:
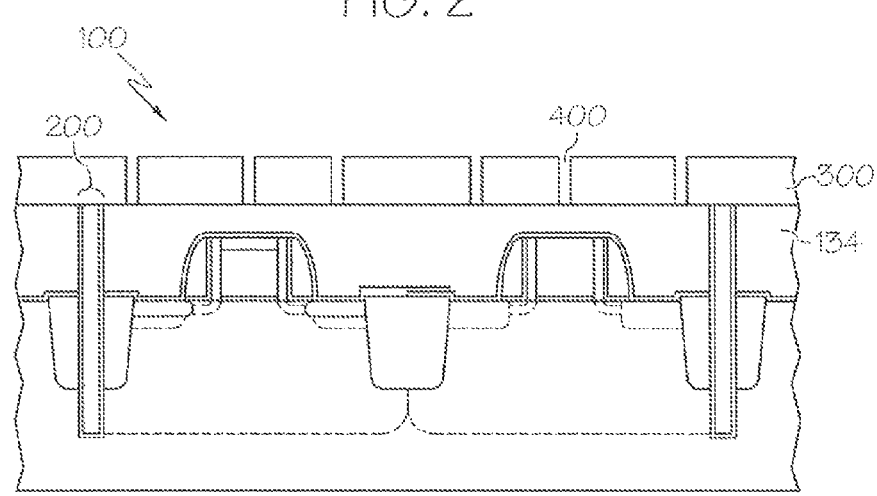

Referring now to FIG. 3, therein is shown the structure of FIG. 2 after forming the insulation layer 300. In at least one embodiment, the insulation layer 300 can be formed over or on the passivation layer 134 and may include a nitride (e.g., a nitride mask), although it is understood that other dielectric materials may be used as well. Generally, the purpose or function of the insulation layer 300 can be to cover and/or protect the TSV 200 from corrosion or contamination that may occur during subsequent electrical contact formations. Typically, the thickness of the insulation layer 300 can vary with the design specifications and/or the current technology process node (e.g., 45 nm, 32 nm, etc.) for the integrated circuit system 100; however, these parameters are not limiting. As such, in accordance with the present embodiments, the thickness of the insulation layer 300 is only to be limited to an amount that protects the TSV 200 from subsequent process steps. In at least one embodiment, the insulation layer 300 can be used as a contact alignment layer. In such cases, an opening 400 can be formed in locations within the insulation layer 300 that define subsequent areas for forming contacts. It will be appreciated by those skilled in the art that the contact alignment process may utilize the positions of the TSV 200, in addition to the conventional reference points used on a mask.

Figure 4:
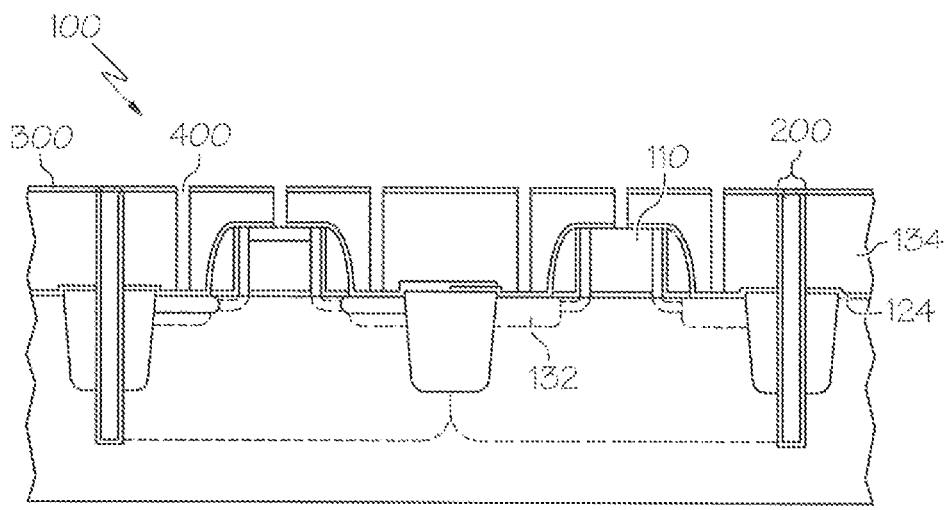

Referring now to FIG. 4, therein is shown the structure of FIG. 3 after forming the contact opening 400. Generally, each of the contact opening 400 can be formed from the top side through the passivation layer 134 and the dielectric layer 124 to contact the gate 110 and the source/drain 132 of each active device by using the insulation layer 300, of FIG. 3, with the opening 400, of FIG. 3, as a mask. Notably, the insulation layer 300 and the location of each of the contact opening 400 prevents corrosion or contamination of the TSV 200, i.e., the contact opening 400 and the TSV 200 are physically and electrically separate from each other. The etchants and techniques used to form the contact opening 400 are well known within the art and not repeated herein. It will be appreciated by those skilled in the art that after forming the contact opening 400, some or most of the thickness of the insulation layer 300 can be removed by processes well known within the art and not described herein.

Figure 5:
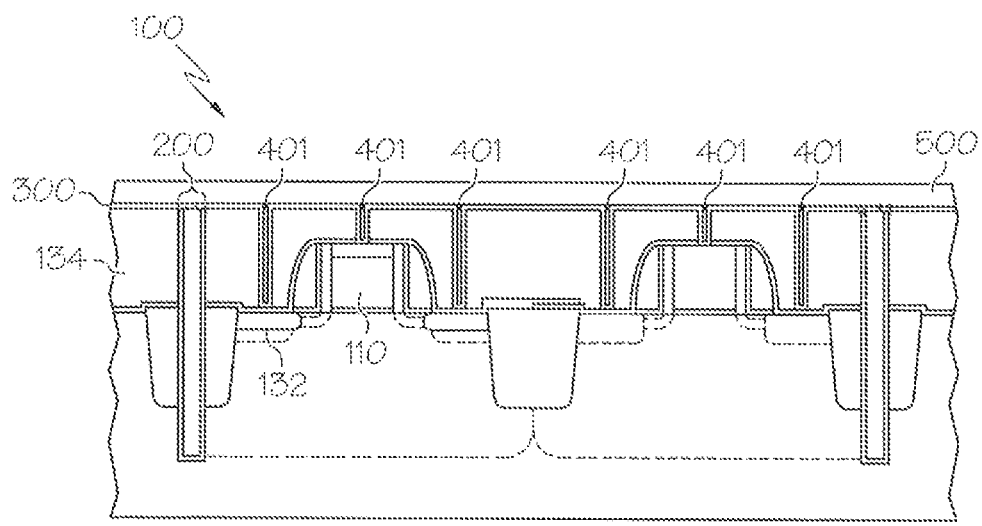

Referring now to FIG. 5, therein is shown the structure of FIG. 4 after forming a conductive layer 500. Generally speaking, the conductive layer can refer to any metal layer, for example, the first metal layers often referred to in the art as "M1", the second metal layer often referred to in the art as "M2", and/or successive metal layers, if any. In the example of FIG. 5 and in the subsequent figures, conductive layer 500 is M1. Generally, the conductive layer 500 can be formed over or on the integrated circuit system 100 and may include any material that offers a low resistance to the passage of electrical current. In at least one embodiment, the conductive layer 500 may include a Cu-type material. In such cases, prior to forming the conductive layer 500, a barrier layer, such as titanium/titanium nitride layer, can be deposited to improve adhesion and to reduce electromigration of the Cu-type material, although it is understood that other barrier layers can be used, as well. Generally, the conductive layer 500 can be deposited by any process that adequately fills each of the contact opening 400, of FIG. 4, thereby forming a solid and robust electrical interconnection (e.g., one without substantial voids) with each of the gate 110 and the source/drain 132. It is to be understood that each of the contact opening 400 can be overfilled to ensure adequate filling of the contact opening 400, thereby forming the device contacts 401. The conductive layer 500 is thereby also formed over or on the insulation layer 300 with an adequate thickness. By way of example, the conductive layer 500 can be deposited by a CVD, a PVD, an ALD type process, or by plating, such as electro-chemical plating. In an embodiment, a via may be formed between the conductive layer 500 and the device contacts 401 and through the insulation layer 300, as is known and commonly employed in the art. In one embodiment, the conductive layer 500 is a patterned conductive layer for electrically connecting the active device contacts with the TSV, using a connective via structure as will be described in greater detail below.

In the exemplary process for forming an IC described above, the TSV 200 was formed prior to the device contacts 401. However, in alternative embodiments, as will be appreciated by those having ordinary skill in the art, a similar process can be employed wherein the device contacts 401 are formed prior to forming the TSV 200. Generally speaking, the order of the process can be varied to suit the particular IC design, and numerous processes therefor are known in the art.

Figure 6:
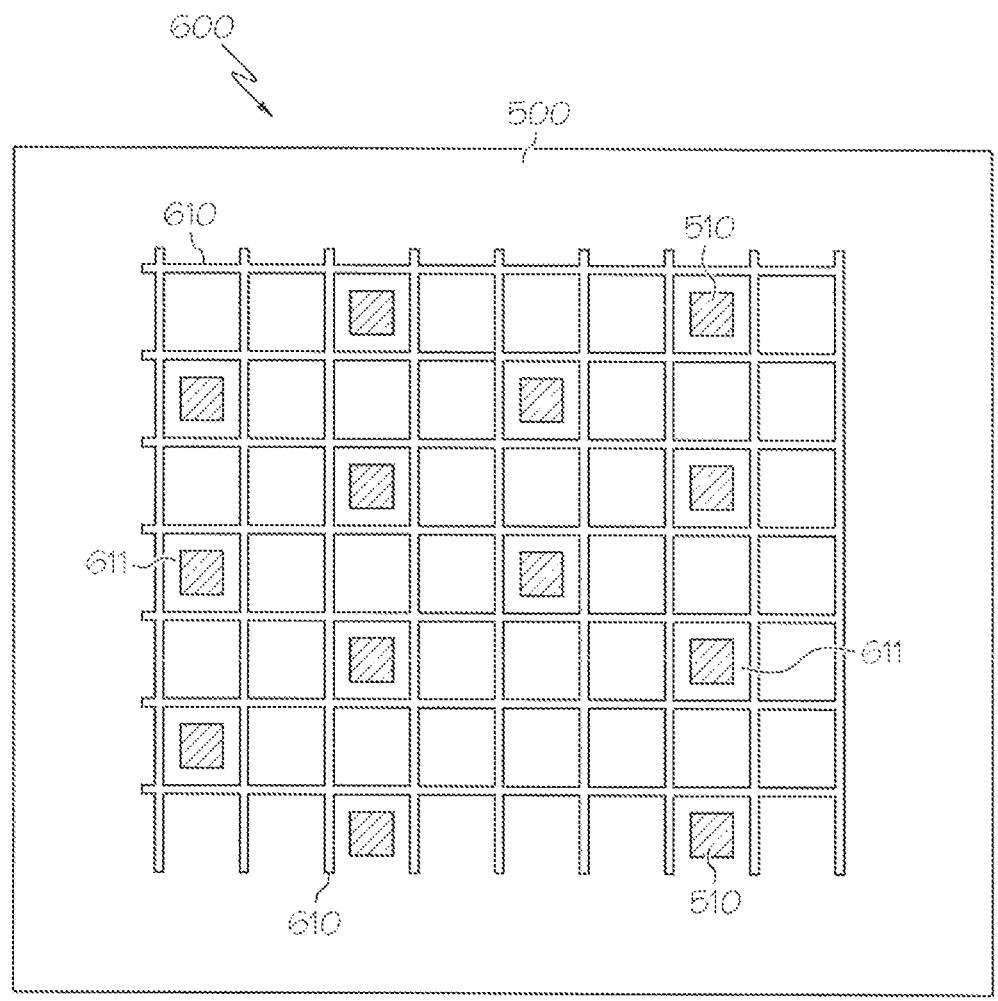
FIGS. 6-7 illustrate, in top view, alternative embodiments of a connecting via structure for electrically connecting the TSV to the conductive layer.
Figure 7:
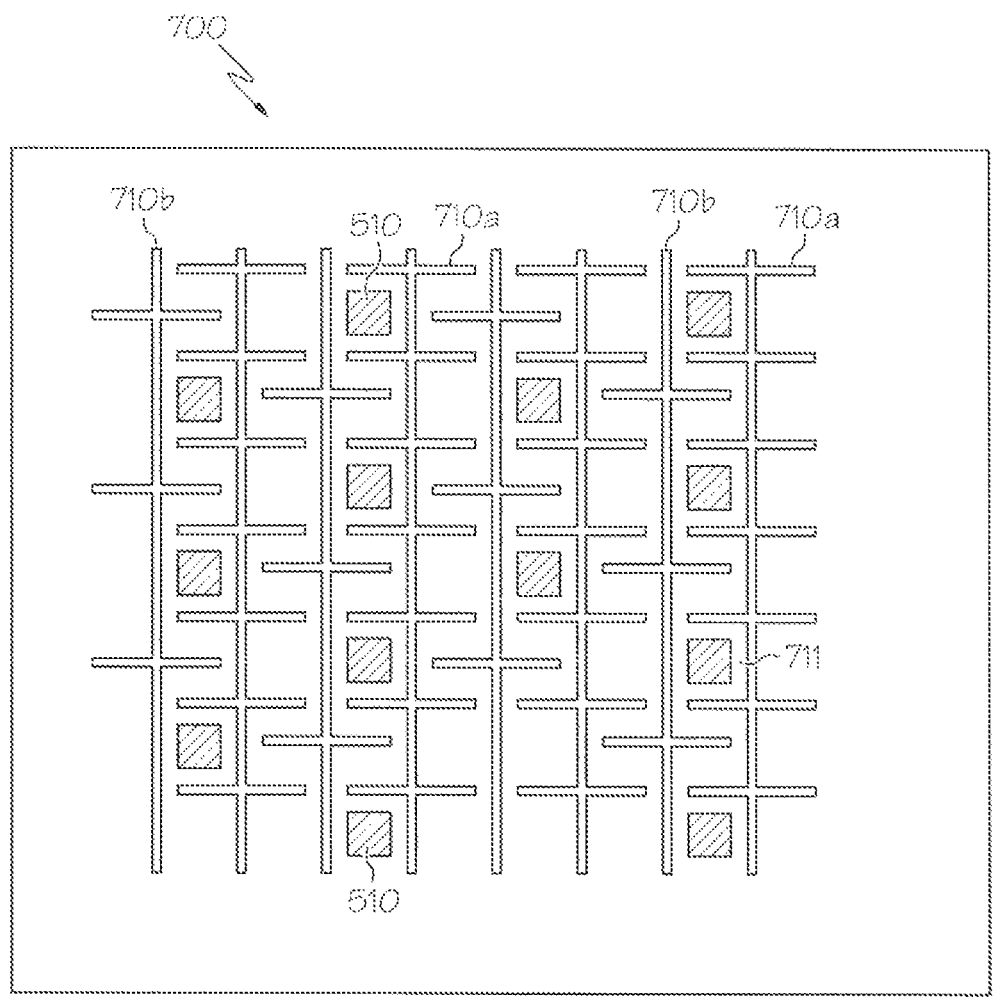
Figure 8:
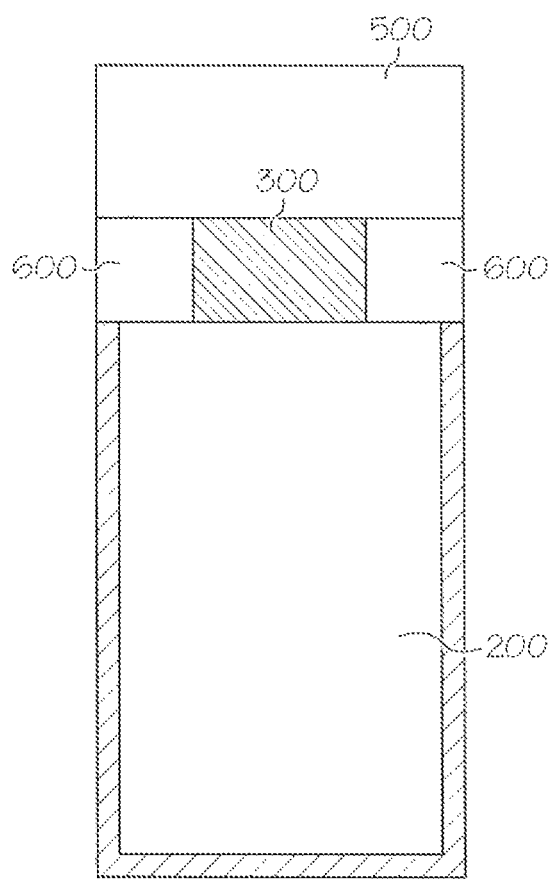
FIG. 8 is an expanded cross-section view of the connecting via structure as implemented in an integrated circuit system.

Greater detail will now be provided with regard to the connection between the conductive layer 500 and the TSV 200, with reference to FIGS. 6-8. As discussed above, it is known in the art to use a "connecting via" to electrically connect the conductive layer 500, e.g. M1, and the TSV 200. However, it has been found that stresses between the TSV 200 and the conductive layer 500 can cause voids to form in the connecting via. As such, there is a need to increase the contact area between the connecting via and the TSV 200 to reduce this stress-induced void.

In one embodiment, referring now to FIG. 6, a connecting via structure 600 is disclosed. The connecting via structure 600 is patterned over the TSV 200, prior to depositing the conductive layer 500 so as to provide an electrical connection between the TSV and the conductive layer 500, as noted above. As such, the connecting via structure 600 extends though insulation layer 300. In one embodiment, the connecting via structure 600 is patterned in the configuration of a "bar net" pattern 610, wherein a first series of parallel via lines are intersected perpendicularly by a second series of parallel via lines, thus forming a "bar net"-like pattern 610. While a perpendicular arrangement is depicted, in other embodiments, the angles between the first and second series may vary from 90 degrees. Additionally, in other embodiments, the lines in each series need not be parallel. The via lines may be formed from any conductive material known in the art for forming vias, including, for example a Cu-type material. The bar net pattern 610 is formed using the minimum via width allowed according to the particular design constraints of the IC design, although greater via widths can be used if desired. The via bar net pattern 610 serves to increase the contact area between the TSV and M1, and decreases stress-induced via voids.

In some embodiments, optionally, the conductive layer 500 is "cheesed." Cheesing, as is known in the art, prevents dishing during planarization, i.e., chemical mechanical polishing. Conductive layer 500 includes a plurality of fill (substrate) pegs 510. As illustrated in FIG. 6, "cheesed" means that conductive layer 500 is provided, by design, with portions (pegs) 510 of insulation extending therethrough leaving a "swiss cheese" appearance from above. The purpose of cheesing is to decrease the local pattern factor of the conductive layer 500 to decrease chemical mechanical polishing (CMP) dishing or erosion, as known in the art. The pegs 510 can therefore be provided in an area 611 between respective perpendicular bars of the via bar net pattern 610, as is shown in FIG. 6.

In another embodiment, referring now to FIG. 7, a connecting via structure 700 is disclosed. The connecting via structure 700 is formed in a bar-line patterns 710*a* and 710*b*, as is shown in FIG. 7. Particularly, the bar-line pattern includes a first series of parallel via bars, which are intersected along their length at regular intervals by a second series of shorter, perpendicular via bars. The second series of parallel via bars intersect only one bar of the first series of parallel via bars, and extend perpendicularly therefrom, terminating before reaching the adjacent parallel via bars of the first series of via bars. While a perpendicular arrangement is depicted, in other embodiments, the angles between the first and second series may vary from 90 degrees. Additionally, in other embodiments, the lines in each series need not be parallel.

So as to allow for the inclusion of cheesing pegs 510, the second series of bars may be staggered, to allow for the inclusion of pegs between the bars in the areas 711. Thus, as shown in FIG. 7, pattern 710*a* includes a greater density of intersecting second series of bars that does pattern 710*b*. As with via structure 600, via structure 700 is formed using the minimum via width allowed according to the particular design constraints of the IC design, although greater via widths can be used if desired. The via bar net pattern 710*a* and 710*b* serves to increase the contact area between the TSV and M1, and decreases stress-induced via voids.

FIG. 8 illustrates the connection between the conductive layer 500 and the TSV 200 (and through the insulation layer 300), in an expanded cross-section (e.g., expanded from FIG. 5 to detail the connecting via structure). As shown therein, the connecting via structure 600 or 700 (connecting via structure 600 is illustrated in the Figure) provides a robust connection between the TSV 200 and the conductive layer 500. For simplicity of illustration, two bars of the via bar net are shown in cross section, while it will be appreciated that the bar net may be made of any practical size in a given implementation. Further, in IC designs where multiple TSVs are provided, each TSV may include a connecting via structure (e.g., 600 or 700) for the connection between each TSV and one or more conductive layers. As such, the connecting via structure (600 or 700) is able to provide an electrical connection between the TSV 200 and the conductive layer 500 while avoiding the stress-induced problems previously encountered in the art with the use of a traditional connecting via.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

What is claimed is:

1. A method of forming an integrated circuit device comprising:
   providing a substrate including an active device;
   forming a solid and continuous through silicon via into the substrate;
   forming a device contact to the active device;
   forming a conductive layer over the through silicon via and the device contact; and
   forming a connecting via structure in between the through silicon via and the conductive layer for electrically and physically connecting the conductive layer with the through silicon via, wherein forming the connecting via structure comprises forming a first series of via bars intersected with a second series of via bars.

2. The method of claim 1, wherein forming the first series of via bars intersected with the second series of via bars comprises forming the first series of via bars are parallel to one another.

3. The method of claim 2, wherein forming the second series of via bars intersected with the first series of via bars comprises forming the second series of via bars are parallel to one another.

4. The method of claim 3, wherein forming the first series of via bars intersected with the second series of via bars comprises forming each of the second series of via bars intersected with each of the first series of via bars.

5. The method of claim 4, wherein forming the first series of via bars intersected with the second series of via bars comprises forming a via bar net pattern.

6. The method of claim 3, wherein forming the first series of via bars intersected with the second series of via bars comprises forming the first series of via bars and the second series of via bars at regularly spaced intervals.

7. The method of claim 6, wherein forming the first series of via bars intersected with the second series of via bars comprises forming each of the second series of via bars intersected with each of the first series of via bars.

8. The method of claim 7, wherein the second series of via bars intersecting one of the bars of the first series of via bars are formed staggered with respect to the second series of via bars intersecting a via bar of the first series of via bars adjacent to the said one of the bars of the first series of via bars.

9. The method of claim 8, wherein the second series of via bars intersecting one of the bars of the first series of via bars are formed spaced apart by a shorter distance with respect to the second series of via bars intersecting a via bar of the first series of via bars adjacent to the said one of the bars of the first series of via bars.

10. The method of claim 9, wherein forming the first series of via bars intersected with the second series of via bars comprises forming a via bar line pattern.

11. The method of claim 1, wherein forming the conductive layer comprises forming a conductive layer that is cheesed with insulation pegs.

12. The method of claim 11, wherein forming the conductive layer comprises forming a conductive layer that is cheesed with insulation pegs that are provided between the respective first and second series of via bars.

13. The method of claim 1, wherein forming the first series of via bars intersected with the second series of via bars comprises forming the first and second series of via bars at a minimum spacing.

14. The method of claim 1, wherein forming the conductive layer comprises forming a conductive layer that comprises a Cu-type material.

15. The method of claim 1, further comprising forming a masking layer over the through silicon via prior to forming the device contact to the active device, and wherein.

16. The method of claim 1, wherein forming the device contact is performed prior to forming the through silicon via.

17. An integrated circuit device, comprising:
a through silicon via formed into a substrate silicon material;
a conductive layer formed over the through silicon via; and
a connecting via structure formed between the conductive layer and the through silicon via for electrically connecting the conductive layer with the through silicon via, wherein the connecting via structure comprises a first series of via bars intersected with a second series of via bars.

18. A method of forming an integrated circuit device comprising:
providing a silicon-based substrate including an active device;
forming a passivation layer over the silicon-based substrate and the active device;
forming a solid and continuous through silicon via through the passivation layer and into the silicon-based substrate;
forming an insulation layer over the passivation layer and over the through silicon via;
forming a device contact through insulation layer and the passivation layer to the active device;
forming a connecting via structure over the through silicon via and through the insulation layer so as to physically and electrically connect the through silicon via with the connecting via structure; and
forming a conductive metal layer over the insulation layer, the connecting via structure, and the device contact so as to physically and electrically connect the connecting via structure with the conductive metal layer, wherein each via bar of the first plurality of via bars and each via bar of the second plurality of via bars is in physical and electrical contact with the through silicon via and with the conductive layer;
wherein forming the connecting via structure comprises:
(1) forming a first plurality of via bars that all extend substantially parallel to one another and are substantially equal in length and that are substantially equidistantly spaced apart from one another, (2) forming a second plurality of via bars that all extend substantially parallel to one another and are substantially equal in length and that are substantially equidistantly spaced apart from one another, wherein each via bar of the second plurality of via bars perpendicularly intersects a first one of the first plurality of via bars at substantially a mid-point of each second via bar, and wherein the length of each via bar of the second plurality of via bars is less than twice the spacing length between each via bar of the first plurality of via bars such that each via bar of the second plurality of via bar only intersects the first one of the first plurality of via bars and not any other of the first plurality of via bars, and (3) forming a third plurality of via bars that all extend substantially parallel to one another and are substantially equal in length and that are substantially equidistantly spaced apart from one another, wherein the length of each via bar of the third plurality of via bars is substantially equal to the length of each via bar of the second plurality of via bars, wherein each via bar of the third plurality of via bars perpendicularly intersects a second one of the first plurality of via bars, which is adjacent to the first one of the first plurality of via bars, at substantially a mid-point of each second via bar, wherein the third plurality of via bars are spaced apart from one another at a distance that is substantially twice a distance at which the second plurality of via bars are spaced apart such that the third plurality of via bars extend into a space only between every other pair of the second plurality of via bars, and
wherein forming the conductive metal layer comprises forming the conductive metal layer having a plurality of cheesed insulator pegs that extend into the conductive material layer, wherein each of the plurality of insulator pegs extend between pairs of the second plurality of via bars into which the third plurality of via bars do not extend.

19. The method of claim 1, wherein each via bar of the first series and each via bar of the second series is in physical and electrical contact with the through silicon via and with the conductive layer.

* * * * *